(12) United States Patent
Faraboschi et al.

(10) Patent No.: US 7,555,419 B2
(45) Date of Patent: Jun. 30, 2009

(54) SIMULATION OF SYSTEM EXECUTION OF INSTRUCTIONS

(75) Inventors: Paolo Faraboschi, Sant Cugat del Valles (ES); Daniel Ortega, Sant Cugat del Valles (ES); Ayose Falcon, Sant Cugat del Valles (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 382 days.

(21) Appl. No.: 11/492,169

(22) Filed: Jul. 23, 2006

(65) Prior Publication Data

US 2008/0126071 A1    May 29, 2008

(51) Int. Cl.
*G06F 9/45* (2006.01)
*G06F 9/44* (2006.01)

(52) U.S. Cl. .......................... 703/22; 703/19; 717/129; 717/131; 717/135

(58) Field of Classification Search .................. 703/22, 703/19; 717/127, 129, 134, 131, 135
See application file for complete search history.

(56) References Cited

U.S. PATENT DOCUMENTS

2004/0111708 A1* 6/2004 Calder et al. ................ 717/131
2005/0204346 A1* 9/2005 Davies ........................ 717/127

OTHER PUBLICATIONS

R. Bedichek, SimNow: Fast platform simulation purely in software, Hot Chips Conf, Aug./Sep. 2004.
AMD SimNow Simulator 4.0.0 User's Manual, Revision 1.41, Jan. 2006.
G. Hamerly et al., SimPoint 3.0: Faster and more flexible program phase analysis, J'l of Instruction-Level Paralleism, Sep. 2005.
E. Perelman et al., Using Simpoint for accurate and efficient simulation, Sigmetrics, Jun. 10-14, 2003.
G. Hamerly et al., How to use SimPoint to Pick Simulation Points, Sigmetrics, 2004.
P.S. Magnusson et al., "Simics: A full system simulation platform," Computer, Feb. 2002.
NAS parallel benchmarks, www.nas.nasa.gov, last updated Jun. 29, 2006.
BYTE Benchmarks, www.byte.com/bmark/bmark.htm, copyright 2005.
Linux/Unix nbench, www.tux.org/~mayer/linux/bmark.html, Dec. 19, 1996.
M. Rosenblum, VMWare's Virtual Platform: A Virtual Machine Monitor for Commodity PC's, Hot Chips Conf, Aug. 1999.
T. Sherwood et al., Automatically characterizing large scale program behavior, ASPLOS X, Oct. 2002.
R. E. Wunderlich et al., SMARTS: Accelerating microarchitecture simulation via rigorous statistical sampling, Procs. of 30 Annual Int'l Simp. on Comp. Arch., Jun. 2003.
J. J. Yi et al., Characterizing and comparing prevailing simulation techniques, Procs. of 11th Int'l Conf. on High Perf. Comp. Arch., Feb. 2005.
F. Bellard, Qemu, a Fast and Portable Dynamic Translator, USENIX 2005 Annual Technical Conference, FREENIX Track, Apr. 2005.

* cited by examiner

*Primary Examiner*—Russell Frejd

(57) ABSTRACT

Instructions to be executed on a system are simulated. Representative simulation phases of the instructions, which most affect simulation results of the instructions to be executed on the system, are dynamically determined. For each representative simulation phase of the instructions, a model is selected from a number of models that provides specified accuracy with a minimal amount of simulation time, and the representative simulation phase is simulated using the model selected. The simulation results for the instructions to be executed on the system are then output.

19 Claims, 5 Drawing Sheets

SIMULATION OF SYSTEM EXECUTION OF INSTRUCTIONS

BACKGROUND

Simulating system execution of applications made up of instructions (viz., processor instructions) is commonly performed. Typically, such simulation is performed to ensure that the system and the applications operate as they are expected or intended to operate. Furthermore, such simulation may be performed to verify that systems, applications, and computer programs that were designed for older, outdated hardware are properly executed using more modern hardware. This type of simulation is known as functional simulation. However, other types of simulation of system execution of instructions are also important.

For instance, another type of simulation simulates how long it will take a system to execute the instructions of a given application. This type of simulation is known as timing simulation. As another example, a type of simulation may simulate how much electrical power the system uses to execute the instructions of a given application. This type of simulation is known as power simulation.

While functional simulation of system execution of instructions is a well-researched area, timing simulation and power simulation of such system execution of instructions have not been as well researched. As a result, timing simulation and power simulation, among other types of simulation, while important, do not have as satisfactory solutions as functional simulation does. For these and other reasons, there is a need for the present invention.

DETAILED DESCRIPTION OF THE DRAWINGS

Figure 1:
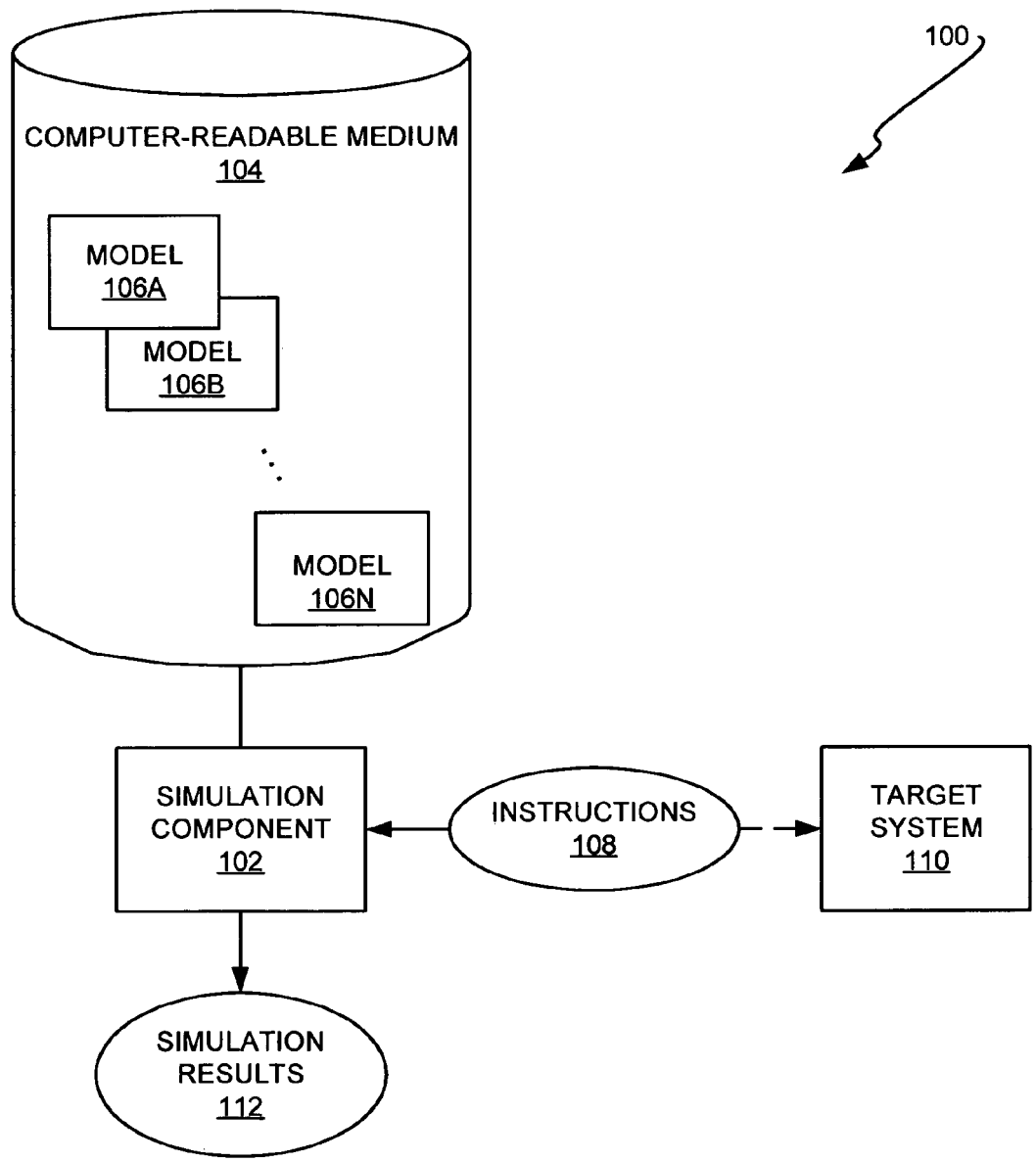
FIG. 1 is a diagram of a system for simulating instructions to be executed on a target system, according to an embodiment of the invention.

FIG. 1 shows a system 100, according to an embodiment of the invention. The system 100 includes a simulation component 102 and a computer-readable medium 104. The system 100 may be implemented within or over one or more computing devices, such as desktop or laptop computers. The simulation component 102 may be implemented in hardware, software, or a combination of hardware and software. The computer-readable medium 104 may be a non-volatile storage device, such as one or more hard disk drives, and/or a volatile storage device, such as volatile semiconductor memory like dynamic random-access memory (DRAM). As can be appreciated by those of ordinary skill within the art, the system 100 may include other components, in addition to the simulation component and the computer-readable medium 104.

The computer-readable medium 104 stores a number of simulation models 106A, 106B, . . . , 106N, collectively referred to as the simulation models 106. There are at least two simulation models 106. The simulation models 106 each is able to simulate execution of instructions 108 on a target system 110. The instructions 108 may be part of one or more applications to ultimately be executed on the target system 110. The target system 110 itself can be or include one or more computing devices, such as single-processor computer system, as well as multiple-processor computer systems. Further details regarding the simulation models 106 are provided later in the detailed description.

The simulation component 102 simulates execution of the instructions 108 by the target system 110, and ultimately provides simulation results 112 corresponding to this simulation. More particularly, the simulation component 102 provides for non-functional simulation of execution of the instructions 108 by the target system 110, such as timing simulation and/or power simulation, among other types of non-functional simulation. That is, the simulation component 102 does not simulate whether the target system 110's execution of the instructions 108 operates as is intended, to provide a desired functional result. Rather, the simulation component 102 simulates other aspects of execution of the instructions 108 by the target system 110.

For instance, the simulation component 102 simulates the length of time the target system 110 incurs in executing the instructions 108, regardless or whether or not such execution yields the desired functional results or not. The simulation results 112 in this example include this length of time incurred. As another example, the simulation component 102 may simulate how much electrical power the target system 110 uses in executing the instructions 108, also regardless of whether or not such execution yields the desired functional results or not. The simulation results 112 in this example include the amount of electrical power used. The simulation component 102 uses the models 106 in simulating the target system 110's execution of the instructions 108, as is described in more detail later in the detailed description.

Figure 2:
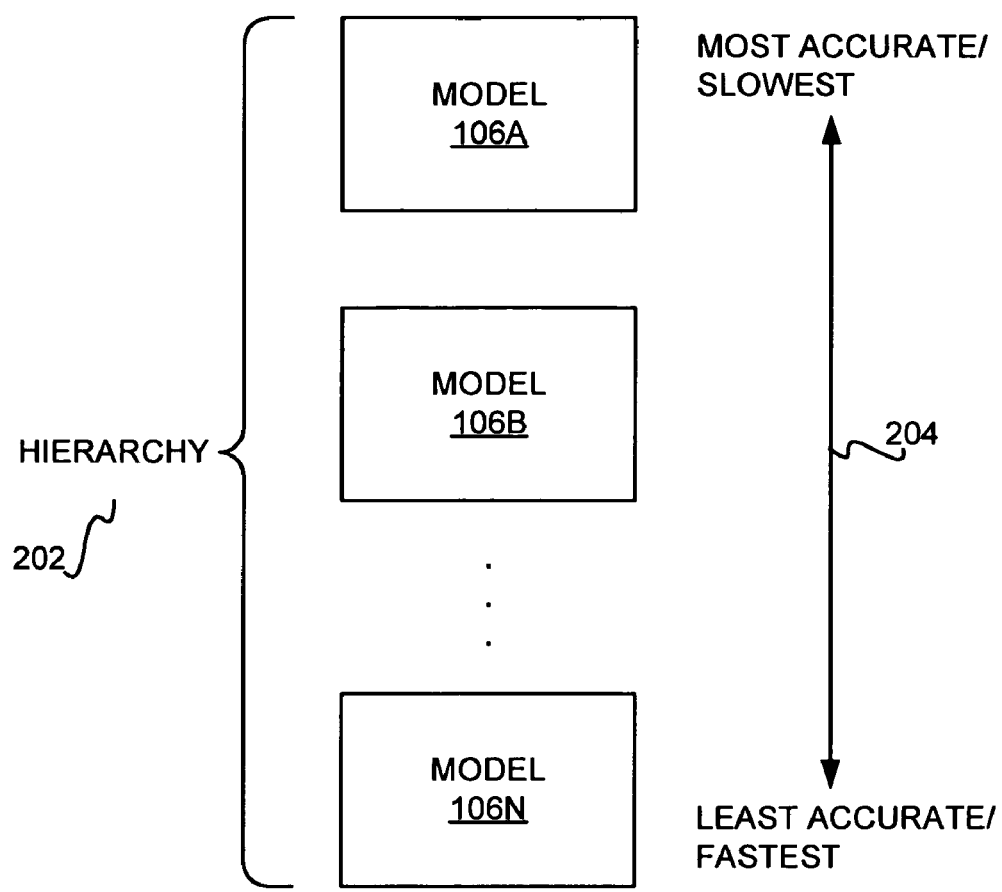
FIG. 2 is a diagram of a hierarchy of models that may be employed for simulating instructions to be executed on a target system, according to an embodiment of the invention.

FIG. 2 shows a hierarchy 202 within which the models 106 are organized, according to an embodiment of the invention. As indicated by the arrow 204, the hierarchy 202 is such that the models 106 higher in the hierarchy 202 provide more accurate simulation results but are slower (i.e., take more time to perform simulation), and the models 106 lower in the hierarchy 202 provide less accurate simulation results but are faster (i.e., take less time to perform simulation). The model 106A at the top of the hierarchy 202 thus provides the most accurate simulation results, but is the slowest in performing simulation, whereas the model 106N at the bottom of the hierarchy 202 provides the least accurate simulation results, but is the fastest in performing simulation.

In one embodiment, no two of the models 106 provide the same accuracy of simulation results, and no two of the models 106 perform simulation at the same speed. That is, each of the models 106 resides at its own unique level within the hierarchy 202. It can be said that in one embodiment, a model in the hierarchy 202 is inclusive of any lower model in the hierarchy 202 where at least one of two conditions are met. First, the model simulates a superset of the components of the target system 110 as to the instructions 108 in question that any lower model simulates. Second, the model simulates the same set of components of the target system 110 as to the instructions 108 in question that any lower model simulates, but in a more accurate and slower manner.

For example, the model 106N may just assign a single cycle of execution time to each of the instructions 108, whereas the model 106A may model execution of each of the instructions 108 in relation to a complex and modern processor having caches, queues, translation-lookaside buffers (TLB's), and so on. The model 106B is therefore less accurate and faster than the model 106A, but more accurate and slower than the model 106N. Thus, when a higher model within the hierarchy 202 is selected as compared to a current model, more components of the target system 110 may be modeled, or at least some of the same components may be modeled with more accuracy. By comparison, when a lower model is selected, fewer components of the target system 110 may be modeled, or at least some of the same components may be modeled with less accuracy.

Figure 3:
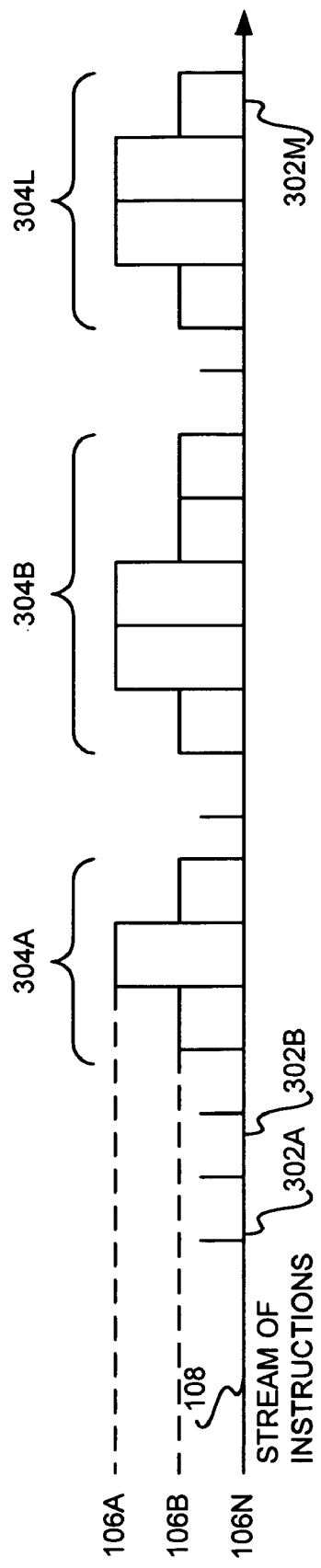
FIG. 3 is a diagram depicting representative and example simulation of a stream of instructions to be executed on a target system, according to an embodiment of the invention.

FIG. 3 shows representative and example simulation of the instructions 108 as a stream of the instructions 108 in succession, according to an embodiment of the invention. The instructions 108 are divided into a number of simulation phases 302A, 302B, ..., 302M, collectively referred to as the phases 302. The simulation phases 302 may each correspond to one or more of the instructions 108. The instructions 108 may, for instance, be grouped in equal numbers to derive the simulation phases 302. Alternatively, the simulation phases 302 may be determined in another manner, such as grouping varying numbers of the instructions 108 based on similar functionalities performed.

A given simulation phase has an importance or "representativeness" from a simulation standpoint that is based on how much the accuracy in simulating the simulation phase affects the accuracy of the simulation results of the all the simulation phases 302 of the instructions 108. For example, a simulation phase is more important and more representative if it requires more simulation accuracy, where otherwise less simulation accuracy of the phase may detrimentally affect the simulation results of all the phases 302 as a whole. Likewise, a simulation phase is less important and less representative if less simulation accuracy of the phase does not detrimentally affect the simulation results of all the phases 302 as a whole.

More important (from a simulation standpoint), or representative, of the simulation phases 302 are modeled using more accurate, but slower, of the models 106, whereas less important, or representative, of the phases 302 are modeled using less accurate, but faster, of the models 106. In the example of FIG. 3, it is presumed that there are three models 106A, 106B, and 106N organized within the hierarchy 202 of FIG. 2. A simulation phase that is not represented by a block in FIG. 3 is modeled by the least accurate but fastest model 106N. A simulation phase that is represented by a short block in FIG. 3 is modeled by the middle-accuracy and middle-speed model 106B. A simulation phase that is represented by a tall block in FIG. 3 is modeled by the most accurate but slowest model 106A.

Therefore, in the example of FIG. 3, the most important (from a simulation standpoint) and representative of the simulation phases 302 are grouped into groupings 304A, 304B, ..., 304L, collectively referring to as the groupings 304. Within each of the groupings 304 of the simulation phases 302, there is at least one simulation phase that is simulated using the model 106A. These simulation phases are the most important (from a simulation standpoint) of the simulation phases 302, and can also be referred to as the most representative of the simulation phases 302. Furthermore, within each of the groupings 304 of the simulation phase 302, there are at least two simulation phases that are simulated using the model 106B. These simulation phases are more important and representative than the phases simulated using the model 106N, but less important and representative than the phases simulated using the model 106A.

It is said that the simulation component 102 dynamically determines the most important and most representative of the simulation phases 302, as the simulation component 102 processes the instructions 108. That is, the simulation component 102 does not undertake a separate or initial "pre-processing" of the instructions 108 to determine which are the most important and most representative of the simulation phases 302. Rather, as the simulation component 102 processes the simulation phases 302 and thus the instructions 108, it dynamically, "on the fly," or at that (same) time determines the most important and most representative of the simulation phases 302. In particular, the simulation component 102 may dynamically determine the relative importance and relative "representativeness" of each of the simulation phases 302 as it processes the instructions 108.

Furthermore, it is also said that the simulation component 102 dynamically adapts the models 106 to the simulation phases 302 based on the characteristics of the instructions 108 within its particular phases 302. For example, depending on how important and how representative a given particular simulation phase is, the simulation component 102 dictates which of the models 106 that the simulation component 102 uses to simulate the instructions 108 of this simulation phase. Less important and less representative of the simulation phases 302 do not require the accuracy provided by the model 106A, for instance, and can instead be modeled by one of the less accurate, but faster, models 106B and 106N. Likewise, more important and more representative of the simulation phases 302 require more accuracy than the model 106N provides, and therefore have to be modeled by one of the more accurate, but slower, models 106A and 106B.

Figure 4:
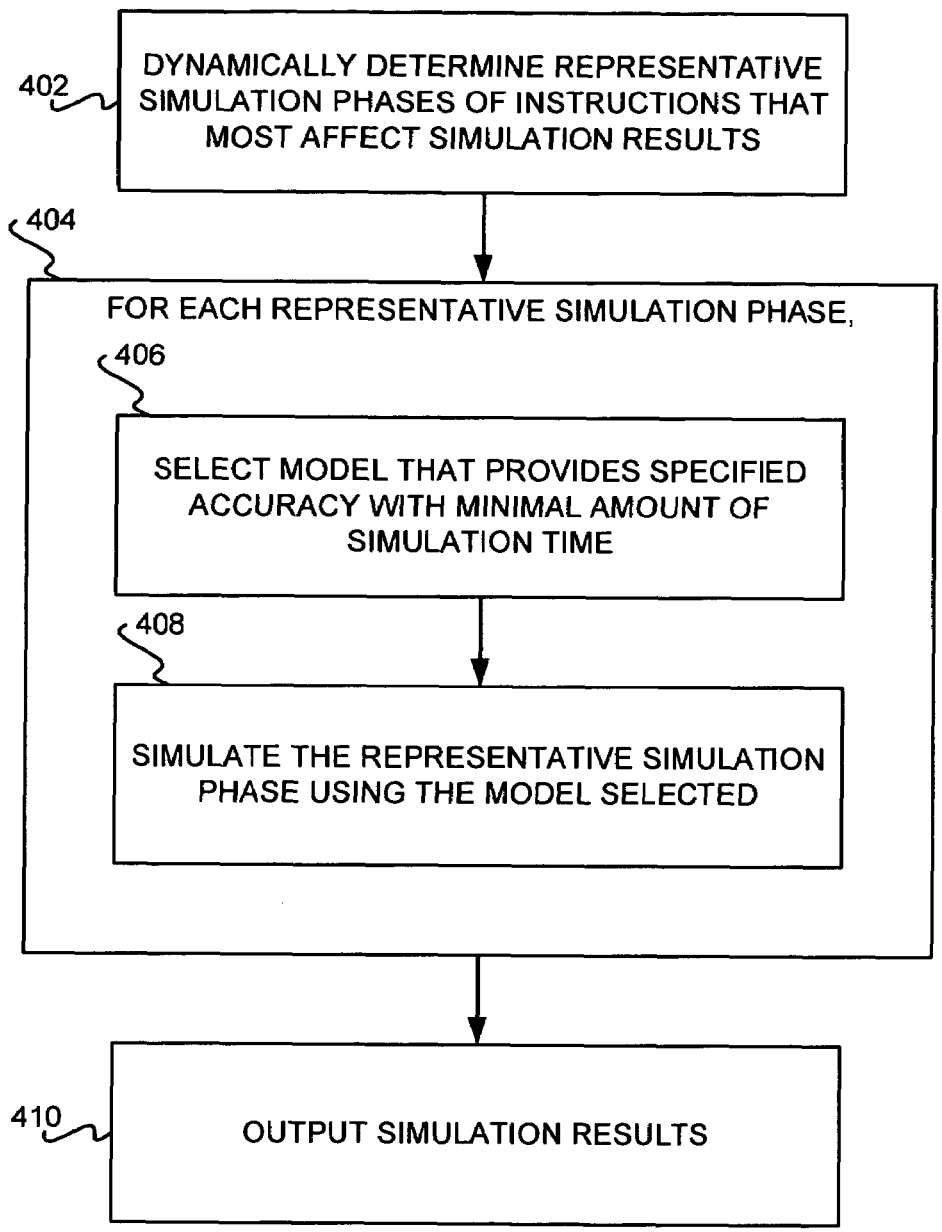
FIG. 4 is a flowchart of a general method for simulating instructions to be executed on a target system, according to an embodiment of the invention.
Figure 5:
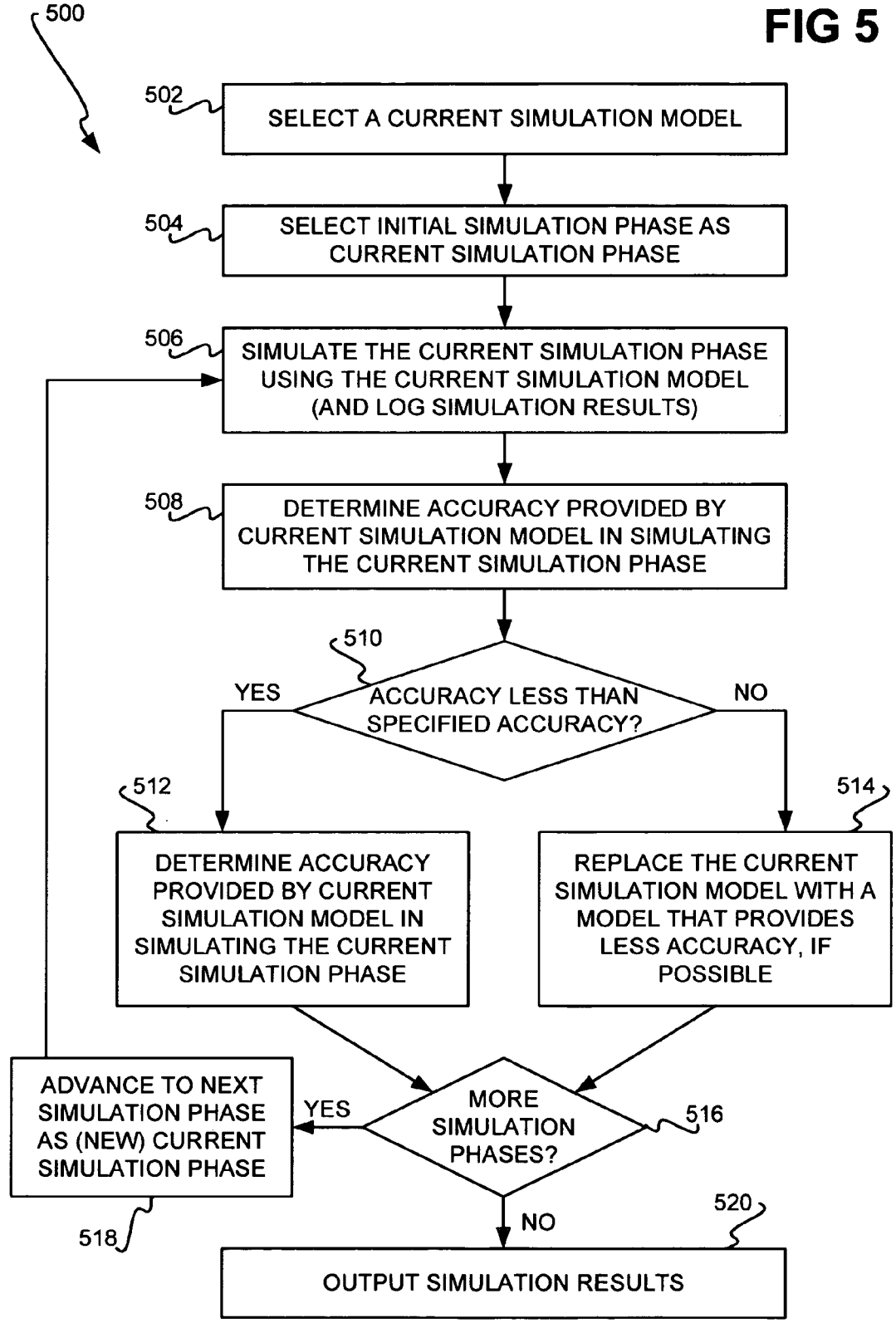
FIG. 5 is a flowchart of a method for simulating instructions to be executed on a target system in a manner that is more detailed than but consistent with the method of FIG. 4, according to an embodiment of the invention.

What follows is a description of two methods that are consistent with one another and that may be performed by the simulation component 102 to simulate the execution of the instructions 108 on the target system 110. The first method, of FIG. 4, is a general method that summarizes the functions performed by the simulation component 102 in one embodiment of the invention, as has been already described in relation to FIGS. 2 and 3. The second method, of FIG. 5, is a more particular method that delineates the actual acts or steps performed by the simulation component 102 to achieve a specific realization of the method of FIG. 4 in one embodiment of the invention. Thus, the method of FIG. 5 can be considered a particular embodiment of the method of FIG. 4.

It is noted that both the methods of FIGS. 4 and 5 can in one embodiment be implemented as one or more computer programs stored on a computer-readable medium. The computer programs may be the computer programs that are, that are part of, or that are performed by the simulation component 102. The computer-readable medium may be a tangible computer-readable medium, such as a non-volatile storage device, and/or a volatile storage device.

Specifically referring first to FIG. 4, then, the depicted method 400 dynamically determines representative simulation phases of the instructions to be executed on the target system (402). The representative simulation phases are those that most affect the simulation results of the simulation of all the instructions to be executed on the target system. In at least one embodiment, such representative simulation phases may include all the simulation phases, and thus all the instructions to be executed on the target system. Thereafter, for each representative simulation phase (404), the following is performed.

First, one of the models is selected (406), where the selected model is that which provides a specified accuracy with the minimal amount of simulation time incurred in order to perform the simulation. The specified accuracy may be set by the user running the simulation, for instance. Second, the representative simulation phase is simulated using the selected model (408), such that the simulation results are logged. Once all the representative simulation phases of the instructions have been simulated by performing part 404, the simulation results for all the representative simulation phases are tallied, and the aggregate simulation results for the instructions in sum are output (410).

It is noted that parts 402 and 404 may be performed in the same process in one embodiment of the invention. That is, as has been alluded to earlier, rather than determining the representative simulation phases within the instructions in a "pre-process," such determination is achieved during the same process in which the simulation phases have models selected for them and thereafter simulated. For instance, a first number of the instructions may be examined to determine whether they are a representative simulation phase, and if so a model immediately selected for the phase and the phase simulated based on the selected model. A second successive number of instructions may be then be processed in this same manner, then a third successive number of instructions, and so on, until all the instructions within a given set of instructions of an instruction stream have been processed.

In one embodiment, parts 402 and 404 may be performed in the same process by employing a predetermined heuristic. The heuristic is used to dynamically determine whether one or more instructions are a representative simulation phase, and if so to select a model for the phase and simulate the phase based on the model selected. Furthermore, the heuristic can in one embodiment presume that all the simulation phases are representative to some degree. In such an embodiment, the heuristic selects a model for a given simulation phase corresponding to the degree of important or "representativeness" of the phase, and then simulates the phase based on the model selected, before proceeding to the next simulation phase and repeating this process.

Referring now to FIG. 5, as has been noted above, the method 500 is consistent with but more detailed than the method that has been described. In particular, the method 500 is one way to achieve the dynamic determination and the model selection and phase simulation of FIG. 4. Furthermore, the method 500 may be considered as an example of a heuristic by which parts 402 and 404 can be implemented. In this sense, the parts of the method 400 may be considered different functions that are achieved by the acts or steps of the parts of the method 500.

First, an initial simulation model is selected as the current model (502). In one embodiment, this current model may be the most accurate simulation model, such as the model 106A, or the least accurate simulation model, such as the model 106N. An initial simulation phase is further selected as the current simulation phase (504). In one embodiment, this current simulation phase is the first simulation phase. That is, this current simulation phase encompasses the first one or more instructions to be executed on the target system. As has been noted, in one embodiment each simulation phase may consist of just one instruction, such that the terms simulation phase and instruction are coincident with one another, whereas in another embodiment each phase may encompass more than one instruction.

The current simulation phase is simulated using the current simulation model (506), and the simulation results of this simulation logged. The accuracy of this simulation is further determined (508). The accuracy may be provided by the simulation model itself, for instance. However, other measures of accuracy can also be employed.

The accuracy that has been determined is compared against the specified accuracy (510), as may have been preset by the user running the simulation of the instructions to be executed on the target system. In one embodiment, the specified accuracy is denoted as an absolute amount of change in accuracy between the simulations of two successive simulation phases. Furthermore, in this embodiment, what is referred to as the accuracy that is determined in part 508 is (and encompasses) the accuracy for the current simulation phase subtracted from the accuracy for the most recent previous simulation phase. The absolute value of the resulting difference is that which is particularly compared against the specified accuracy in part 510. It is noted, of course, that in such an embodiment, the very first iteration of part 508 will not yield an accuracy value, since in the first iteration just one simulation phase has been simulated.

In any case, if the accuracy determined in part 508 is less than the specified accuracy (510), then the current simulation model is replaced with a simulation model that provides more accuracy (512), if possible. For example, with respect to the hierarchy 202 encompassing the three models 106A, 106B, and 106N, if the current simulation model is the model 106N, then it can be replaced with either the model 106B or the model 106A because either of these two models provides more accuracy than the model 106N. However, if the current simulation model is already the model 106A, which is the most accurate model, then the current simulation model is not replaced, but remains the model 106A.

In one embodiment, the current simulation model is replaced with the model immediately above it in the hierarchy. For example, with respect to the hierarchy 202 encompassing the three models 106A, 106B, and 106N, if the current simulation model is the model 106N, then it is always replaced by the model 106B in this embodiment, and never the model 106A. Likewise, the model 106B is replaced as the current simulation model by the model 106A.

If the accuracy determined in part 508 is greater than the specified accuracy (510), however, then the current simulation model is replaced with a simulation model that provides less accuracy (514), again if possible. For example, with respect to the hierarchy 202 encompassing the three models 106A, 106B, and 106N, if the current simulation model is the model 106A, then it can be replaced with either the model 106B or the model 106N because either of these two models provides less accuracy than the model 106A. However, if the current simulation model is already the model 106N, which is the least accurate model, then the current simulation model is not replaced, but remains the model 106N.

In one embodiment, the current simulation model is replaced with the model immediately below it in the hierarchy. For example, with respect to the hierarchy 202 encompassing the three models 106A, 106B, and 106N, if the current simulation model is the model 106A, then it is always replaced by the model 106B in this embodiment, and never the model 106N. Likewise, the model 106B is replaced as the current simulation model by the model 106N.

It is noted that the current simulation model, when replaced in either part 512 or part 514, is not for the current simulation phase, but rather for the next simulation phase. That is, once a current simulation phase has been simulated, it is not simulated again. The selection of a new simulation model rather is for simulation of the next simulation phase. Thus, after part 512 or part 514, if there are more simulation phases that have not yet been simulated (516), then the next simulation phase is advanced to as the (new) current simulation phase (518), and the method 500 repeats at part 506. Once all the simulation phases have been processed, the simulation results for all the simulation phases as a whole are tallied and output (520).

Using the heuristic of the method 500 of FIG. 5 results in the following behavior. Simulation phases within groupings of simulation phases that require a high-accuracy simulation model are ultimately simulated by such a model, because as each of these simulation phases is simulated, the current simulation model is replaced by a higher-accuracy model. In this sense, the heuristic of the method 500 of FIG. 5 effectively dynamically determines the most representative and most important simulation phases, and ultimately simulates these phases using higher-accuracy simulation models. Likewise, simulation phases within groupings of simulation phases that only require a low-accuracy simulation model are ultimately simulated by such a model, because as each of these simulation phases is simulated, the current simulation model is replaced by a lower-accuracy model.

We claim:

1. A method for simulating a plurality of instructions to be executed on a system, comprising:
   in a computing device, dynamically determining a plurality of representative simulation phases of the instructions that most affect simulation results for the instructions to be executed on the system;
   for each representative simulation phase of the instructions,
      selecting a model from a plurality of models that provides specified accuracy with a minimal amount of simulation time;
      simulating the representative simulation phase using the model selected; and,
   outputting the simulation results for the instructions to be executed on the system,
   wherein the models are ordered within a hierarchy, such that a model in the hierarchy is inclusive of any model lower in the hierarchy.

2. The method of claim 1, wherein the method simulates a length of time for the instructions to be executed on the system.

3. The method of claim 1, wherein the method simulates power consumed by the system in executing the instructions.

4. The method of claim 1, wherein the models are further ordered within the hierarchy from least accurate/fastest simulation time to most accurate/slowest simulation time, such that a model in the hierarchy is necessarily more accurate and slower in simulation time than a model lower in the hierarchy, and vice-versa.

5. The method of claim 1, wherein a model in the hierarchy is inclusive of any model lower in the hierarchy where:
   the model simulates a superset of components of the system that any model lower in the hierarchy simulates; and/or,
   the model simulates a same set of components of the system that any model lower in the hierarchy simulates, but in a more accurate and slower in simulation time manner.

6. The method of claim 1, wherein dynamically determining the representative simulation phases of the instructions that most affect the simulation results and selecting the model that provides specified accuracy within the minimal amount of simulation time for each representative simulation phase are performed in a same process.

7. The method of claim 6, wherein the same process for dynamically determining the representative simulation phases of the instructions that most affect the simulation results and for selecting the model that provides specified accuracy within the minimal amount of simulation time for each representative simulation phase comprises employing a predetermined heuristic.

8. The method of claim 7, wherein employing the predetermined heuristic comprises:
   for each representative simulation phase of the instructions, in succession,
      simulating the representative simulation phase using a current model;
      determining an accuracy provided by the current model in simulating the representative simulation phase;
      where the accuracy provided by the current model in simulating the representative simulation phase is less than the specified accuracy,
         replacing the current model with a model that provides more accuracy but that is slower for use in simulating a next representative simulation phase, where a model that provides more accuracy but that is slower exists; and,
      otherwise,
         replacing the current model with a model that provides less accuracy but that is faster for use in simulating the next representative simulation phase, where a model that provides less accuracy but that is faster exists.

9. A computer-readable medium storing a computer program having computer code executable by a computing device, where executing the computer program causes the computing device to execute the computer code, where the computer code is for simulating a plurality of instructions to be executed on a system, and where the computer code comprise:
   first computer code to, for each of a plurality of simulation phases of the instructions, in succession:
      simulate the simulation phase using a current simulation model;
      determine an accuracy provided by the current simulation model in simulating the simulation phase;
      where the accuracy provided by the current simulation model in simulating the simulation phase is less than a specified accuracy,
         replace the current simulation model with a simulation model that provides more accuracy but that is slower for use in simulating a next simulation phase of the instructions, where a simulation model that provides more accuracy but that is slower exists;
      otherwise,
         replace the current simulation model with a simulation model that provides less accuracy but that is faster for use in simulating the next simulation phase of the instructions, where a simulation model that provides less accuracy but that is faster exists; and,
   second computer code to output simulation results for the instructions to be executed on the system.

10. The computer-readable medium of claim 9, wherein the computer code simulates a length of time for the instructions to be executed on the system.

11. The computer-readable medium of claim 9, wherein the computer code simulates power consumed by the system in executing the instructions.

12. The computer-readable medium of claim 9, wherein the computer code employs a plurality of simulation models ordered within a hierarchy from least accurate/fastest simulation time to most accurate/slowest simulation time, such that a simulation model in the hierarchy is necessarily more accurate and slower in simulation time than a simulation model lower in the hierarchy, and vice-versa.

13. The computer-readable medium of claim 9, wherein the computer code employs a plurality of simulation models ordered within a hierarchy, such that a simulation model in the hierarchy is inclusive of any simulation model lower in the hierarchy.

14. The computer-readable medium of claim 13, wherein a simulation model in the hierarchy is inclusive of any simulation model lower in the hierarchy where:
   the simulation model simulates a superset of components of the system that any simulation model lower in the hierarchy simulates; and/or,
   the simulation model simulates a same set of components of the system that any simulation model lower in the hierarchy simulates, but in a more accurate and slower in simulation time manner.

15. A system to simulate a plurality of instructions to be executed on a target system, comprising:
   a computer-readable medium storing a plurality of models ordered within a hierarchy from least accurate/fastest simulation time to most accurate/slowest simulation time, such that a model in the hierarchy is necessarily more accurate and slower in simulation time than a model lower in the hierarchy, and vice-versa; and,
   a simulation component to simulate each of a plurality of simulation phases of the instructions in succession using a model that the simulation component selects from the plurality of models using a predetermined heuristic, and to output simulation results for the instructions to be executed on the target system.

16. The system of claim 15, wherein the simulation component simulates a length of time for the instructions to be executed on the target system.

17. The system of claim 15, wherein the simulation component simulates power consumed by the target system in executing the instructions.

18. The system of claim 15, wherein the models are ordered within the hierarchy such that a model in the hierarchy is inclusive of any model lower in the hierarchy, and
   wherein a model in the hierarchy is inclusive of any model lower in the hierarchy where:
   the model simulates a superset of components of the system that any model lower in the hierarchy simulates; and/or,
   the model simulates a same set of components of the system that any model lower in the hierarchy simulates, but in a more accurate and slower in simulation time manner.

19. The system of claim 15, wherein the simulation component is to simulate each of the simulation phases of the instructions in succession using a model that the simulation component selects from the plurality of models using the predetermined heuristic by:
   for each simulation phase of the instructions, in succession,
      simulating the simulation phase using a current model;
      determining an accuracy provided by the current model in simulating the simulation phase;
      where the accuracy provided by the current model in simulating the simulation phase is less than a specified accuracy,
         replacing the current model with a model that provides more accuracy but that is slower for use in simulating a next simulation phase, where a model that provides more accuracy but that is slower exists; and,
      otherwise,
         replacing the current model with a model that provides less accuracy but that is faster for use in simulating the next simulation phase, where a model that provides less accuracy but that is faster exists.

* * * * *